United States Patent [19]

Karasikov et al.

[11] Patent Number: 5,105,147
[45] Date of Patent: Apr. 14, 1992

[54] WAFER INSPECTION SYSTEM

[75] Inventors: Nir Karasikov; Yoel Ilssar, both of Haifa, Israel

[73] Assignee: Galai Laboratories Ltd., Migdal Haemek, Israel

[21] Appl. No.: 356,701

[22] Filed: May 25, 1989

[30] Foreign Application Priority Data

May 26, 1988 [IL] Israel ............................ 86514

[51] Int. Cl.$^5$ .......................... G01R 1/06; G06F 15/46
[52] U.S. Cl. ........................ 324/158 F; 324/158 R; 356/401; 901/44
[58] Field of Search ........... 324/158 F, 158 P, 73 PC, 324/96; 250/491.1; 356/400, 401; 364/513, 551.01; 414/924, 788.9; 198/394, 395; 901/46, 47, 44

[56] References Cited

U.S. PATENT DOCUMENTS

| | | |
|---|---|---|
| 4,103,232 | 7/1978 | Sugita et al. ................ 324/158 F |
| 4,516,253 | 5/1985 | Novak ......................... 250/491.1 |
| 4,604,715 | 8/1986 | Toutant et al. .................. 356/400 |
| 4,653,011 | 3/1987 | Iwano ............................ 901/46 |
| 4,656,358 | 4/1987 | Divens et al. ................. 250/491.1 |
| 4,694,243 | 9/1987 | Miller et al. ..................... 324/96 |
| 4,755,746 | 7/1988 | Mallory et al. ................ 324/158 F |
| 4,772,846 | 9/1988 | Reeds ........................... 324/158 R |
| 4,786,867 | 11/1988 | Yamatsu ........................ 356/401 |

FOREIGN PATENT DOCUMENTS

| | | | |
|---|---|---|---|
| 0239037 | 11/1985 | Japan ................. | 324/158 P |
| 0070432 | 3/1988 | Japan ................. | 324/158 P |

*Primary Examiner*—Kenneth A. Weider
*Assistant Examiner*—Vinh P. Nguyen
*Attorney, Agent, or Firm*—Fleit, Jacobson, Cohn, Price, Holman & Stern

[57] ABSTRACT

A system for the semiautomatic inspection of printed circuits on silicon wafers and other similar micro-electronic products which comprises in combination a floating table supporting a robot arm which has the function of grabbing a single wafer from a cassette in which it is housed, inverting same, or assuming a position with its axis defining the Y-axis of the scanning system, and of moving in this direction; and of placing after inspection such wafer in another cassette according to the grade it received; an optical inspection device, such as optical microscope combined with a TV camera or the like attached to said same table, said microscope being adapted to move in the direction of the X-coordinate of the inspection system, there being provided means for aligning the direction of the printed circuit with the X-Y coordinates of the scanning system. A sophisticated optoscanner system is used for the alignment of the wafer and for establishing its exact position. The wafer is held by a vacuum gripper from the moment of its removal from the first cassette and up to its insertion into another one.

3 Claims, 9 Drawing Sheets

FIG. 5
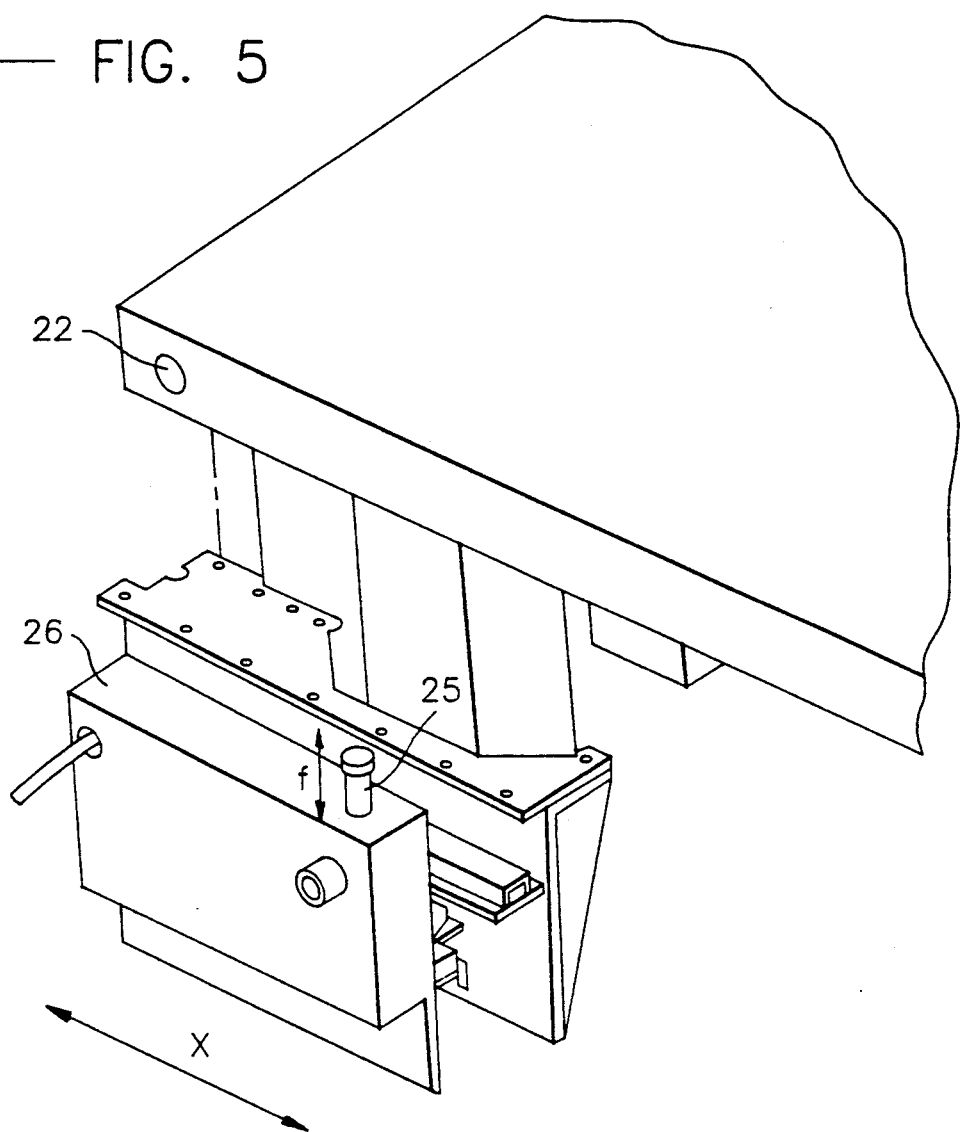
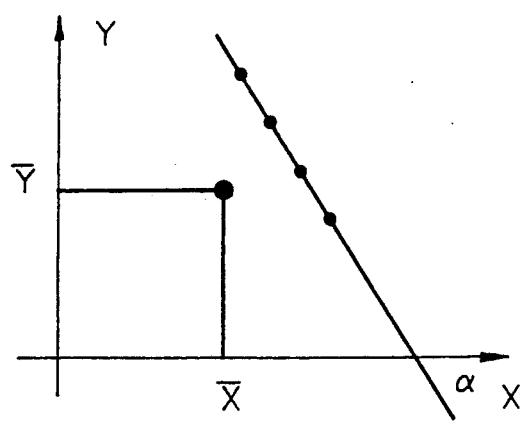

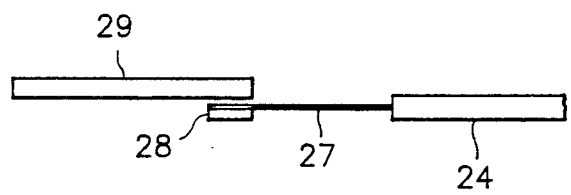
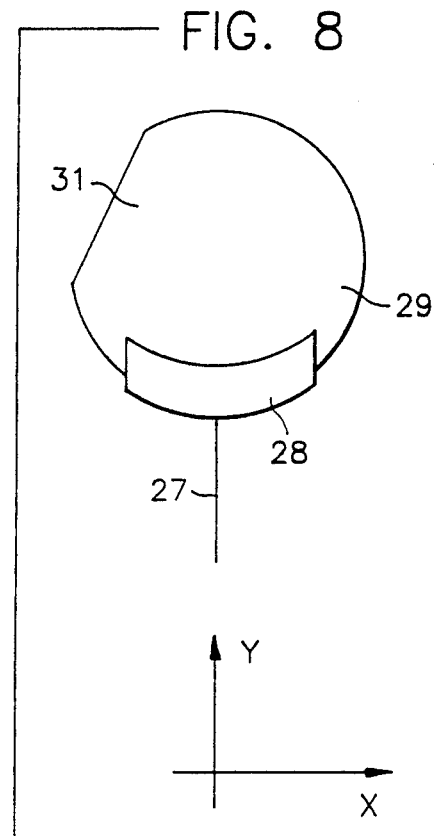
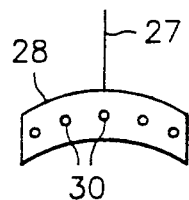
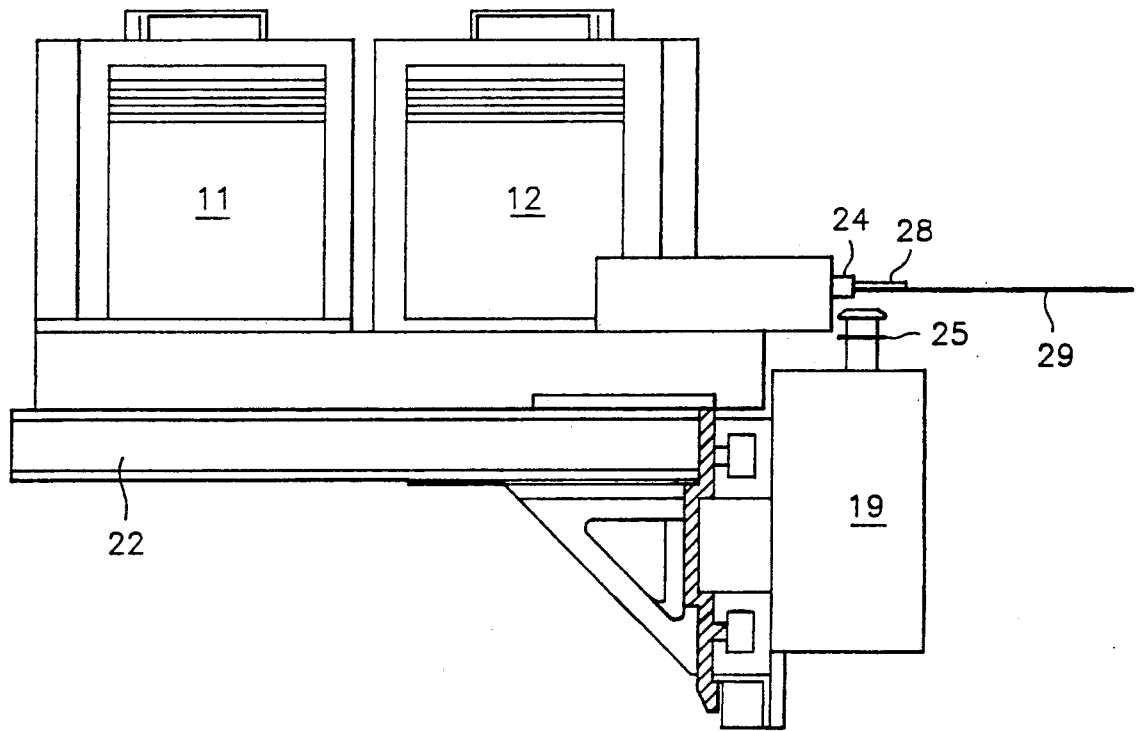

WAFER INSPECTION SYSTEM

FIELD OF THE INVENTION

The invention relates to a device for the inspection of silicon hips and especially of wafers with such chips (printed circuits). The device is suited for the inspection of chips which are produced with a plurality of layers, of wafers such as 8" wafers, etc. The novel device is characterized by improved features, such as single transfer of the wafer starting with its withdrawal from a cassette and up to its being positioned in another cassette, according to the classification obtained during the inspection.

Contamination of the wafer during inspection is minimized. There are also provided means for the exact centering of the wafer respective to a reference system.

BACKGROUND OF THE INVENTION

Semiconductor wafers are produced by complicated multi-step processes. The production of sophisticated electronic chips from wafers may include as many as about 150 steps. Technologies in the submicron range are very delicate, and there always exists a chance of error or malfunction at each of the many stages, which ought to be discerned as soon as possible. Inspection during the production process and at its end is an imperative stage of the production process and there exists a real need for effective inspection means, capable of inspecting a large number of wafers in an accurate manner within a reasonable time period.

Automated devices are developed in the 1960s, and it was customary to inspect the wafers after each production step by means of an optical microscope by an operator, In the 1970s the process was automated to a certain degree and automatic means were provided for transporting the wafers from a cassette to the inspection stage, with a precision stage position of autofocus inspection, classification of the wafer and its insertion into a specific cassette according to the grading of the specific wafer.

This enabled the operator to concentrate on the inspection itself without wasting time or concentration on the handling. Such automation increases the number of wafers that can be inspected per unit time and also improves the overall accuracy and reliability of the inspection by the human operator.

Automatic handling systems were further developed and are currently available from several manufacturers with extra features such as accumulation of defects statistics and automatic differentiation of the inspected wafers for accept, reject, and redo-stations.

Further development in the fields of inspection was the introduction of automatic inspection machines which analyze the inspected wafers and determine the defect location automatically. The task of the operator is thus minimized to classification of the defects and determination of their severity. Some machines are available in this group with prices typically over $750,000 each.

The gap between the automatic handling systems and the heavy duty automatic inspection systems is the field of our invention.

SUMMARY OF THE INVENTION

The present invention provides automated inspection devices which make possible the effective inspection of large numbers of wafers per unit time, which are considerably less expensive than fully automated systems available. The inspection process is advantageously automated, thus removing as far as possible the human operator from the vicinity of the wafers under inspection.

The system of the invention prevents contamination and minimizes breakage during handling. The wafer is being held by one handling means from the step of removal from a cassette and until the termination of the inspection and its insertion into another cassette. It is another feature of the invention that an optoscanner is used in order to determine in a highly accurate manner the position of the chips on the waver respective the inspection means. Means are provided to align the printed circuits with the coordinates of the inspection system. The wafer is removed from the cassette while being held by handling means using a vacuum to grip the wafer, turned upside-down, and inspected by a microscope or other inspection device which points upwards, thus minimizing contamination of the wafer by any contaminant setting on it from above. The waver can be inspected using X-Y coordinates or any other coordinate system. When the X-Y coordinate system is used, one of the axes is that defined by the extension or retraction of a robot arm holding the wafer (Y-axis), while the other perpendicular axis (X) in the plane of the wafer, is defined by the movement in such direction of the upwards looking inspection instrument. The focusing (in this case the Z direction) is effected by an upward or downward movement of the inspection instrument, such as a TV or other microscope.

The robot arm used is programmed to swing about the Z axis over a certain arc, grip and remove the wafer from a cassette by applying a vacuum to a narrow zone at its circumference, swinging it back in the Z-direction, align with the Y-direction, and move the wafer so as to position it above the inspection device. At this stage the wafer is turned by 180°, so that its printed circuits point downwards, and means are actuated for the exact determination of the wafer respective the inspection system.

For this purpose an opto-scanner is used, which moves a number of times across the boundary of the edge of the wafer, thus defining its center line, and by a number of measurements, its exact center. Generally the wafers are provided with a cut-off segment, and this missing sector facilitates the exact definition of the wafer respective the inspection means.

The wafer is located in a clean environment, and all the components used are chosen in such a manner as to ascertain this feature. The wafer is removed from the cassette by a robotic arm which is mounted on a vibration isolated table. The robot arm defines the Y coordinate while a microscope, facing upwards, moves so as to scan the X coordinate. Focusing can be effected manually or automatically in the Z coordinate, whenever required. Other inspection means can be used. After termination of the inspection, the wafer is again flipped over by 180°. Scanning in X-Y coordinates are preferred, but inspection can also be effected based on angular or rotational coordinates. The inspection can be effected by means of an optical microscope, if desired using a suitable filter. There can also be used inspection means such as UV, IR, particle beams, surface scanning, dark field inspection device, tunneling microscope, etc. Any suitable surface inspection means can be used.

The inspection can be made using a TV camera, pointing upwards, which is aligned in such a manner so that its direction of scan of the wafer will be aligned with the direction of the printed circuit on the wafer. The wafers are generally cut to remove a segment. The angular alignment of the wafer is made by means of an optocouple which crosses the edge of the wafer at a plurality of points and thus determines both the angular position of the wafer and also its exact center. One can use a photosensor parallel with the microscope, pointing upwards which measures reflected light from the wafer. The scan is in the X-coordinate with a number of measurements in parallel scans; also detecting the missing segment. This defines the exact position.

Generally the print on the wafer is exact as regards its position with a tolerance of about 50 microns, the field of view of the microscope being of the order of about 500 μ.

Illumination for optical inspection is advantageously via fiber optics to prevent any possible heat disturbances.

During the inspection the microscope moves in the X-direction; after a scan the robot arm moves for a predetermined distance in the Y-direction, stops, and the scan in the X-direction is repeated.

The robot has the following 4 axes of motion:
R along its length, defining the Y axis;
Z height;
$\theta$ about the Z axis;
Q about the R axis.

The robot position itself in front of the appropriate cassette, at the proper angle $\theta$, at proper height Z. The gripper is horizontal with the vacuum holes pointing up. See FIGS. 7 to 12.

The vacuum gripper is an edge gripper whose curvature corresponds to a diameter of the wafer it is made for, and narrow enough to access of the cassette. The wafer accesses the cassette from below the wafer and moves up until it touches the wafer, and the vacuum grips it and lifts it up to a fixed elevation so that the wafer can be removed from the cassette. The gripper maintains its hold on the wafer by means of the vacuum and the wafer is extracted from the cassette and is held, as shown i FIG. 10. The robot arm moves about the Z axis (i.e. $\theta$ motion) and lines up its R-direction with the Y-direction, as shown in FIG. 11. As this motion is completed, the gripper inverts the wafer to the position shown in FIG. 12.

The edge gripper enables the inspection of the wafer on both sides. The robot lowers and locks itself to its zero position (rest position) on or just above the table surface, with the wafer above the TV microscope unit. At this point, the wafer is in a position to be scanned by the TV microscope, with the Y motion being provided by the robot arm, and the X scan motion by the lateral movement of the microscope unit. The microscope has the capability of Z movement to focus the image. This novel, single-transfer design, eliminates the necessity to have a manipulator place the wafer on an X-Y table, for inspection and reduces the probability of wafer breakage, reduces handling time, and reduces contamination on wafer surface (by inverting it).

WAFER'S REGISTRATION METHODS

The wafer handling subassembly presents an uncertainty of about +/− 2 mm in the wafer's relative position on the gripper, after fetching a wafer from a cassette.

Registration methods were developed in order to obtain accurate information on this relative position.

One method is as follows: An external opto-coupler sensor is connected to the microscope unit, near the objective lens. The sensor is looking upwards, to sense light reflection from the face-down wafer's surface. When a wafer is present above the sensor, a reflection is sensed, and the sensor's output signal is low ("0"). When no wafer is present above the sensor, there is no reflection and the output signal is high ("I"). While scanning across a wafer's edge, the signal is inverted from high to low or vice-versa. This inversion indicates the exact edge crossing point. The Y motion commences and takes place in programmed steps of $\Delta$ y, where $\Delta$ y depends on the accuracy desired. After each $\Delta$ y step, the microscope is moved laterally, in a programmed step of $\Delta$ x.

For the i-th step, when a reflection is first sensed, the X and Y positions are registered ($X_i^1$, y). The lateral X-directional scan continues until no reflection is first sensed. This position is recorded as ($X_i^2$, y) for i=(1 . . . n) where n is a function of $\Delta$ y, the accuracy, the speed required by the user, and the wafer size.

At each step "i" the following calculations are made:

$$X_1 = \frac{\hat{X}_i^1 + X_i^2}{2} \quad \text{(a)}$$

and $$m_i^1 = \frac{X_i^1 - X_{i-1}^1}{\Delta Y}, \ m_i^2 = \frac{X_i^2 - X_i^2}{\Delta y}, \quad \text{(b)}$$

If either $m_i^1 = m_{i-1}^1$ or $m_i^2 = m_{i-1}^2$ then the $X_i^1$ corresponding to the i for which the equality holds is recorded as a flat edge point in the "flat edge file" along with its Y coordinate;

If $m_i^1 \neq m_i^1$ and $m_1^2 \neq m_i^2$, then the calculation $\bar{x}_i$ is registered and is interpreted as a measure of the X coordinate of the Y center line of the wafer. When the programmed number of the $\Delta$ y steps is completed, the arithmetic average $\bar{x}$ of the registered $\bar{x}_i$ measurements is calculated and taken as the coordinate of the Y-axis center line of the wafer.

In the event that the flat edge is parallel to the X axis, then this be recognized at the i-$^{th}$ step when $|x_i^1 - x_i^2| > \gamma$ and either at the (i−1)th step of (i+1l)th step there will not be sensed any reflection whereas at the i-th step there is a reflection. In such case, calculation will commence or terminate at the $i^1$-th step, where $\gamma$ is a function of the diameter of the wafer and of the standard length of the edge.

In a similar fashion, the microscope (X) is programmed to advance in a series of steps $\Delta$ x and after each such step, the robot arm moves the wafer across the stationary microscope. In this way, the Y coordinate for the X axis center line (y) is calculated.

At this point, the unit has determined the location of the wafer center relative to the coordinates x-y of the device.

Further, the coordinates points located on the wafer flat edge and a collection of slope calculation $m_ik$, are recorded. From the average value of these slopes, the orientation angle, and between the flat and the X axis, is calculated.

The invention is illustrated with reference to the enclosed schematical drawings, not according to scale, in which:

FIG. 5 illustrates the X-stage with the microscope;

FIG. 6 is a side-view of the gripping mechanism;

FIG. 7 is a top view of the vacuum gripper;

FIG. 8 illustrates the vacuum gripper with wafer held by it;

FIG. 9 is a side-view of the system illustrating wafer cassettes and other components of the system;

Figure 1:
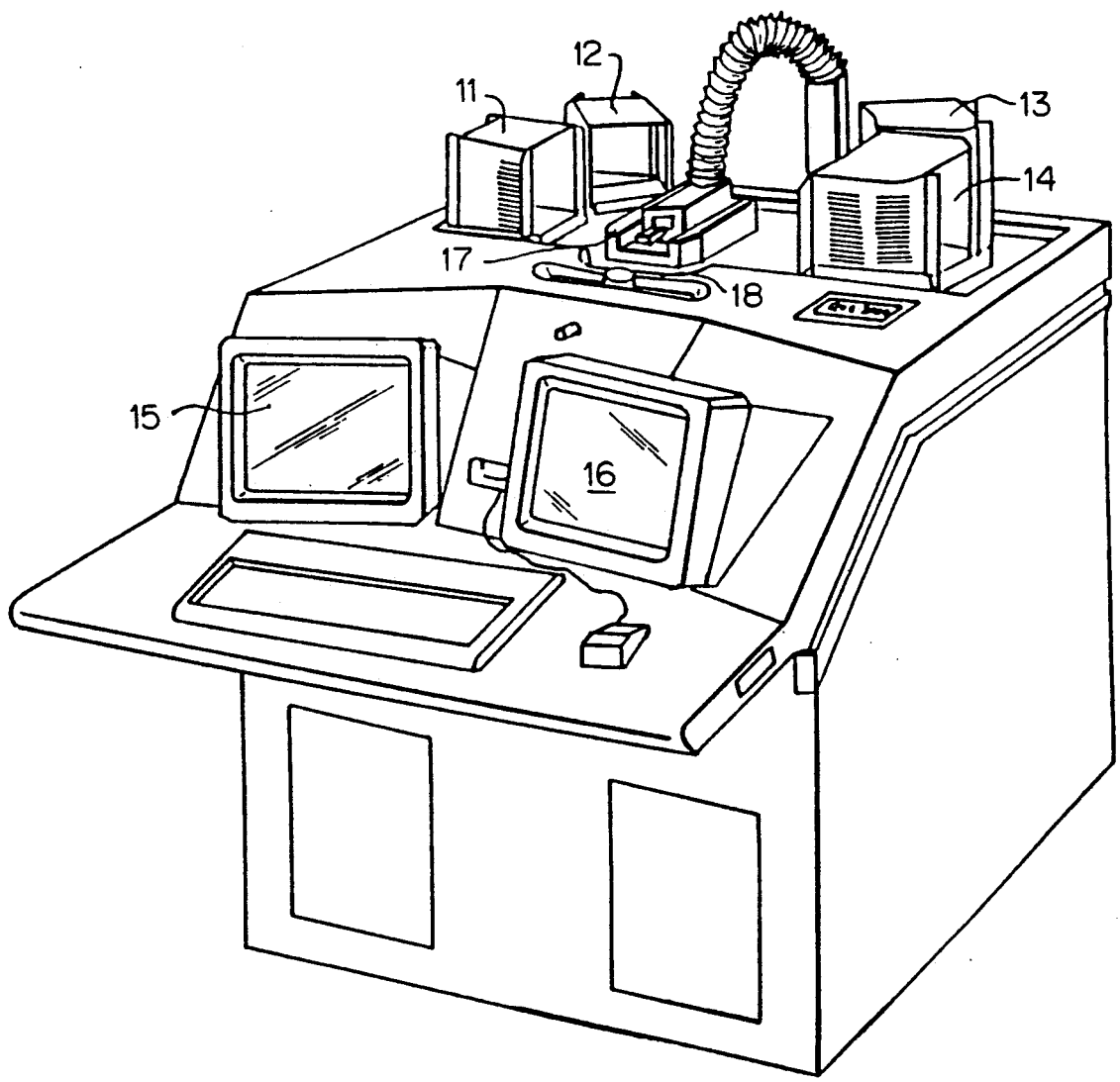
FIG. 1 is a perspective general view of a system of the invention.

In the following description identical parts are given the same number. As shown in FIG. 1, the system is an integrated unit with 4 cassettes 11, 12, 13 and 14 housing the wafers; 11 before inspection and the others after inspection and grading according to quality. The inspection is done, for example by means of a microscope, with the picture displayed on screens 15 and 16, the wafer being held by robot arm 17 with the microscope 18 pointing upwards.

The robot arm is actuated by a mechanism in housing 19, with the arm 20, which defines the Z-axis pointing upwards. This arm 20 protrudes after assembly via the opening 21 in Table 22. The arm can move up and down and turn about its axis, making a swinging movement over a predetermined arc.

Figure 2:
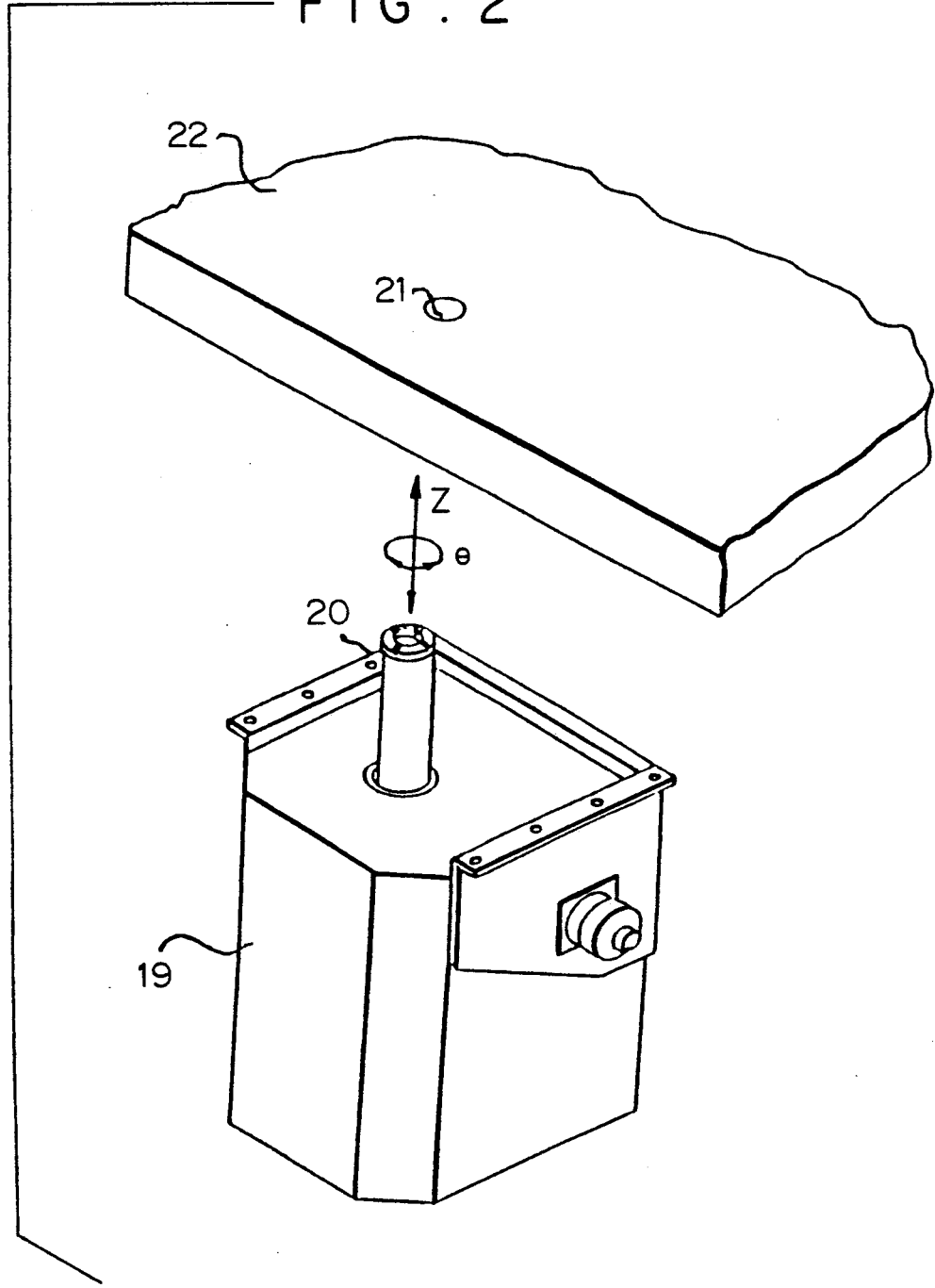
FIG. 2 illustrates the operation of the robot arm of the device.
Figure 3:
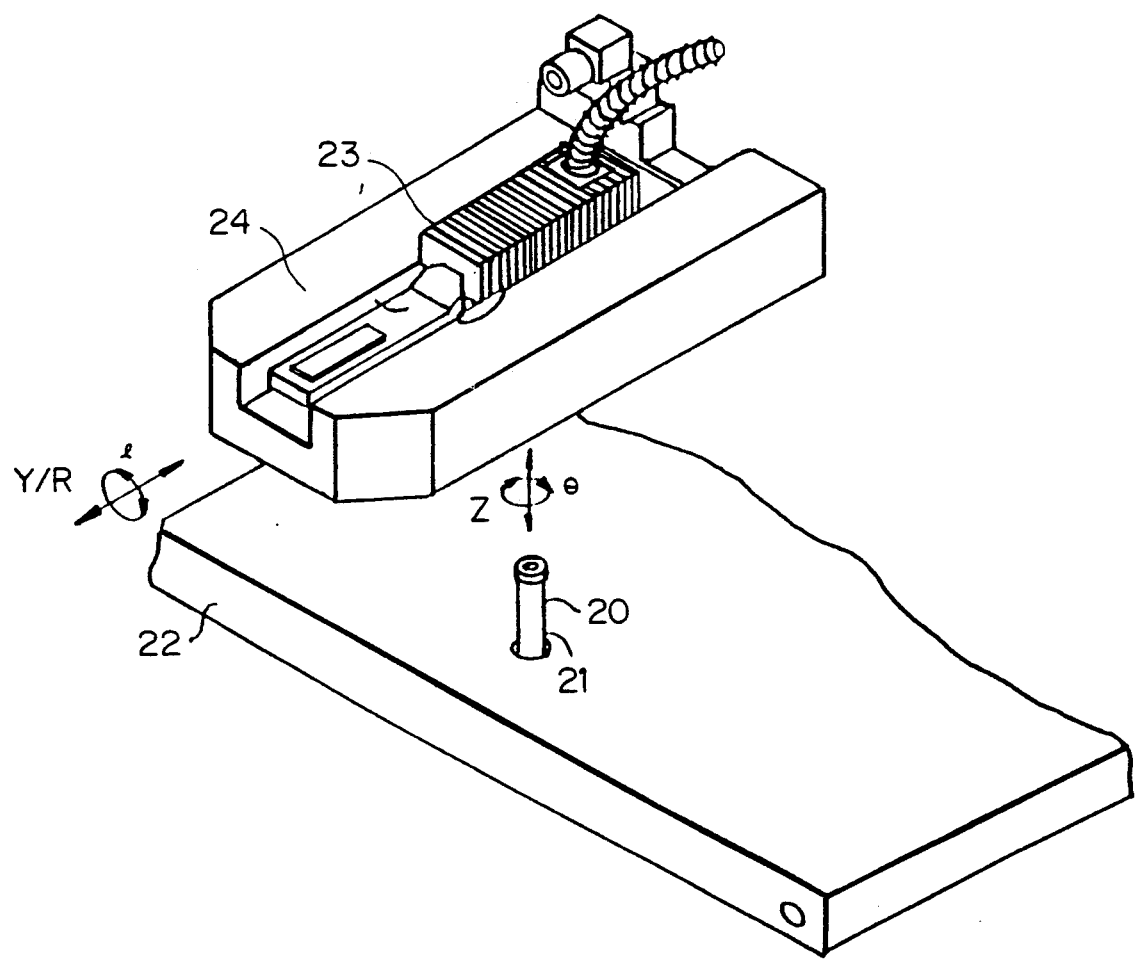
FIG. 3 illustrates the robot arm of the device.

As illustrated in FIG. 2, also FIG. 3 shows the arm 20 protruding via opening 21 in Table 22, this arm being attached to the upper robot mechanism 23 which comprises another arm 24, which defines the Y-axis and which can turn about its axis so as to turn the wafer held by it by 180°.

Figure 4:
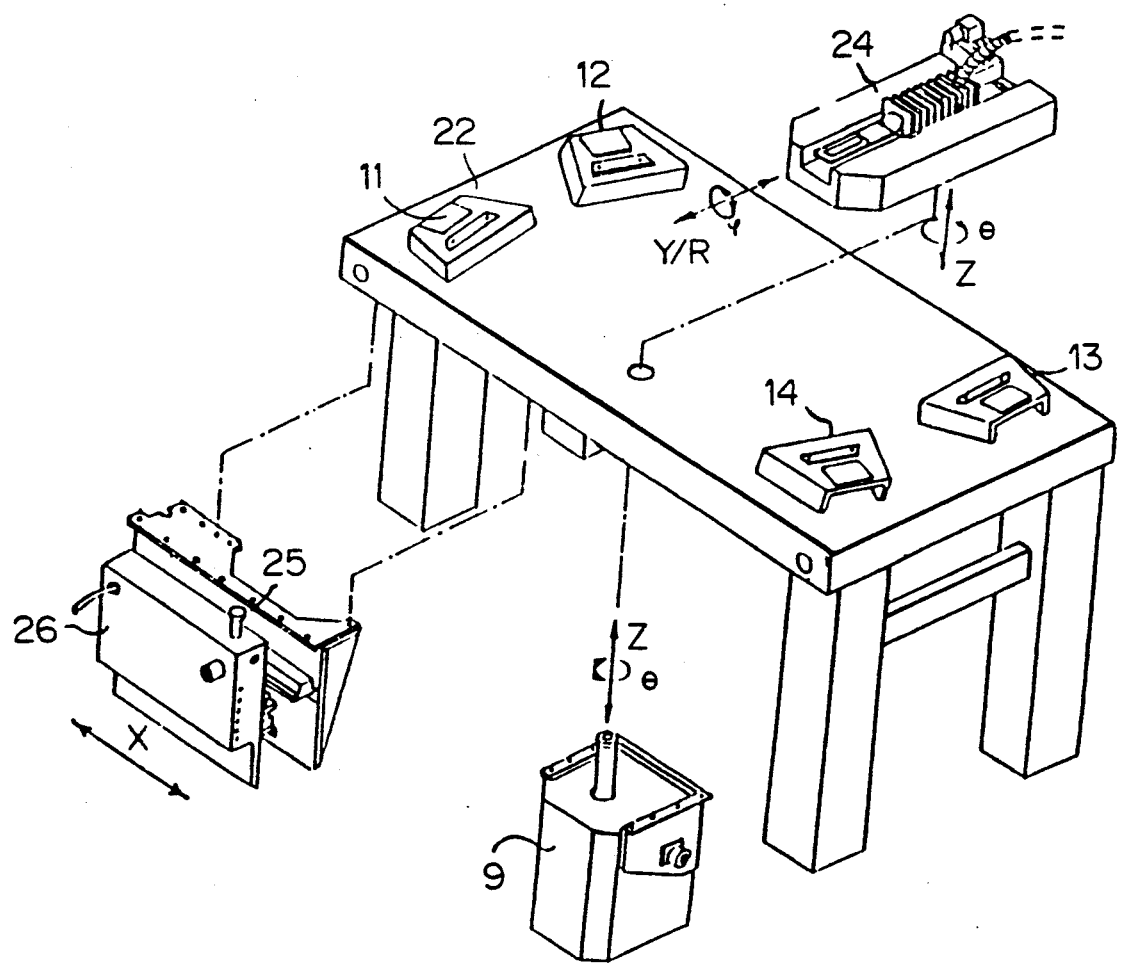
FIG. 4 is an exploded view illustrating the axes and part of the mechanisms of the device.

FIG. 4 illustrates in an exploded view the main components, Table 22, cassette holder supports of cassettes 11, 12, 13 and 14, robot arm 24, lower robot mechanism in housing 19, upwards pointing inspection means, such as a microscope (TV microscope or other device) 25 with its mechanism in housing 26.

FIG. 5 illustrates the X-coordinate stage 26, attached to Table 22, with upwards pointing microscope 25, unit 26 being able to move in the X-direction as indicated, which is perpendicular to that of the movement of the upper robot arm 24, which moves in the Y-direction. FIG. 6 illustrates schematically the gripping mechanism comprising an arm 27 (extension of 24), connected with means for establishing and maintaining a vacuum, and vacuum gripping means 28 adapted to hold firmly and securely the wafer 29. As shown in FIG. 7 this gripper 28 (shown from above) has a plurality of holes 30 through which the suction is established.

As shown in FIG. 8, the gripper 27 grips the wafer 29 at its edge, such wafer having a cut-off segment at 31.

FIG. 9 again illustrates the main features of the mechanism: the Table 22, which is a floating (vibration isolated) table, with microscope unit 19 attached to it, microscope 25 pointing upwards, gripper 28 holding wafer 29, which gripper is attached to the robot arm 24, with two of the wafer cassettes being shown (11 and 12).

Figure 13:
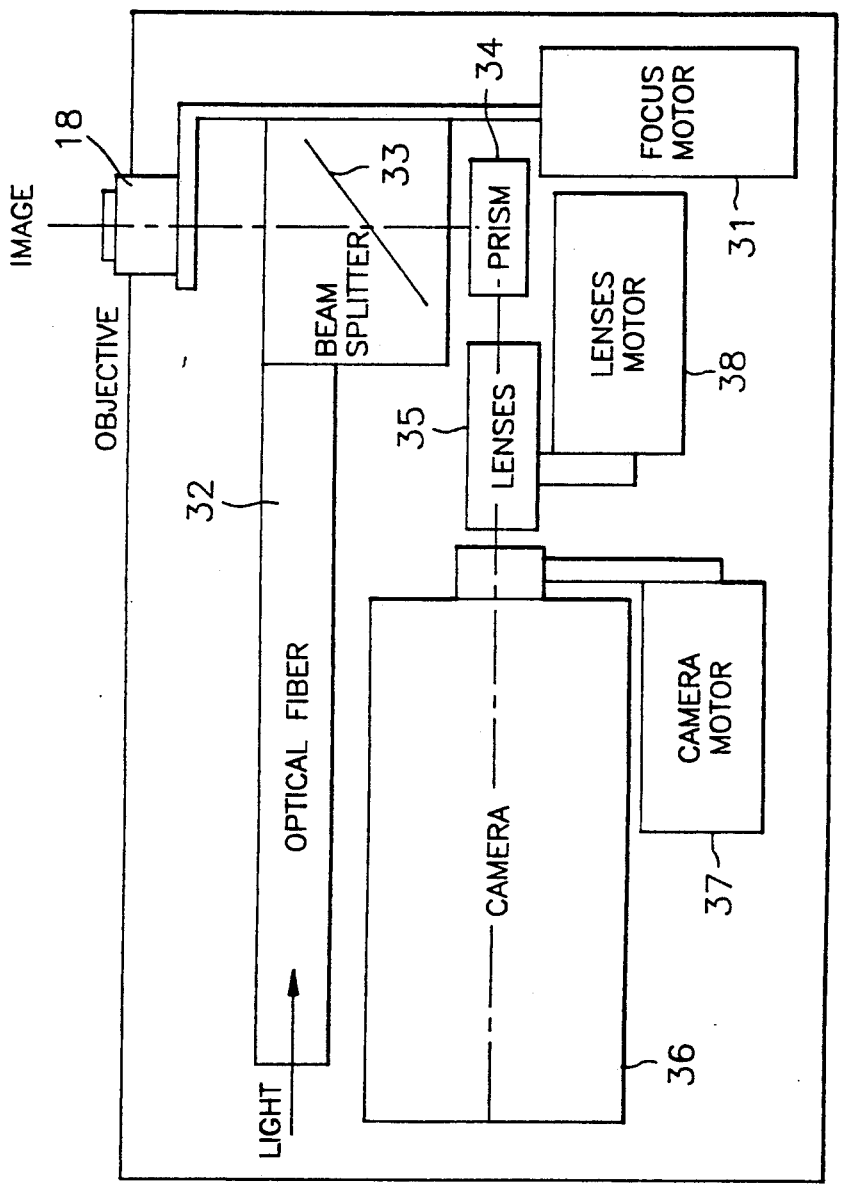
FIG. 13 is a side-view in block diagram form illustrating the arrangement of optical components in a system of the invention.

As illustrated in FIG. 13, the optical system comprises a microscope 18 attached to a focusing motor 31. Light is supplied from a light source via optical fiber 32, reaching beam splitter 33, which directs part of the light at the object (wafer) above the microscope. The image rays pass via the beam splitter 33, reach prism 34 wherefrom the rays pass via lens system 35 to camera 36. The camera is provided with a motor drive 37, whereas the lens system is provided with a motor 38.

Figure 10:
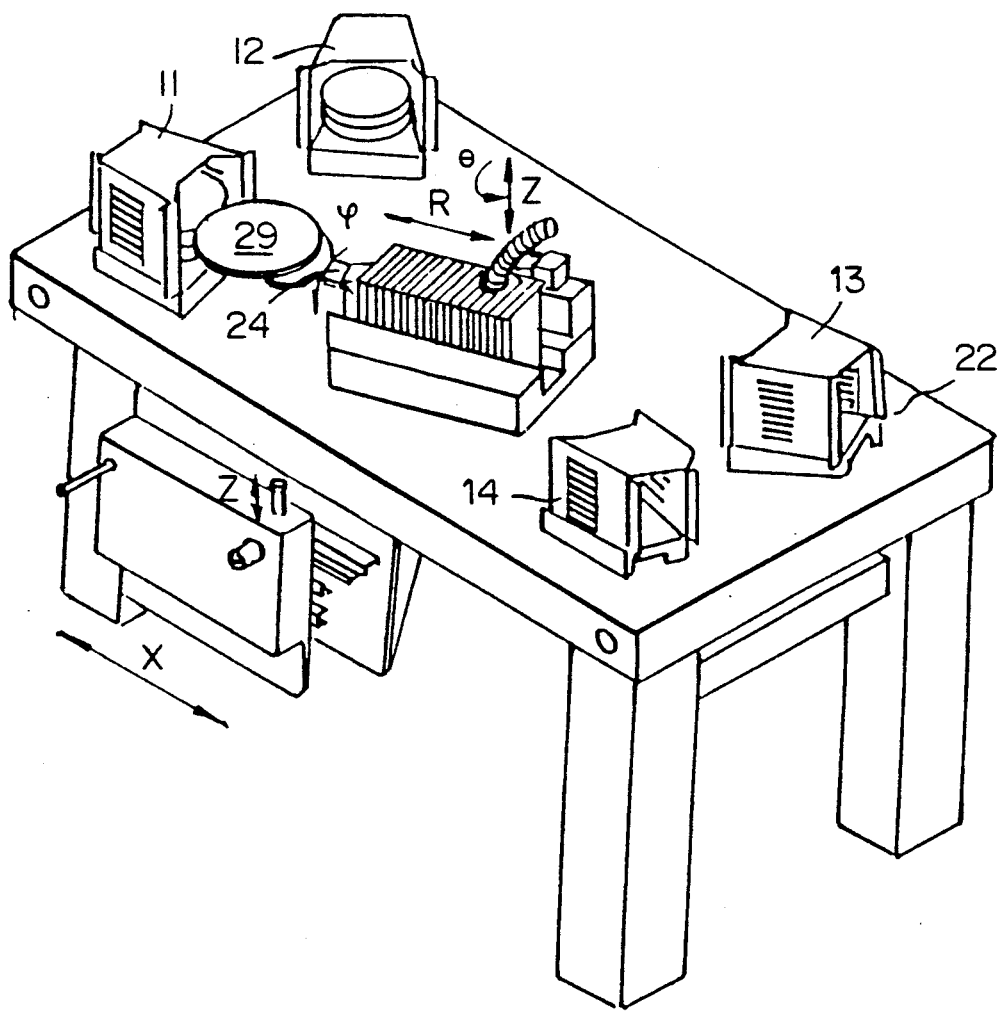
FIG. 10 illustrates the gripper with the wafer with printed circuit facing upwards.
Figure 11:
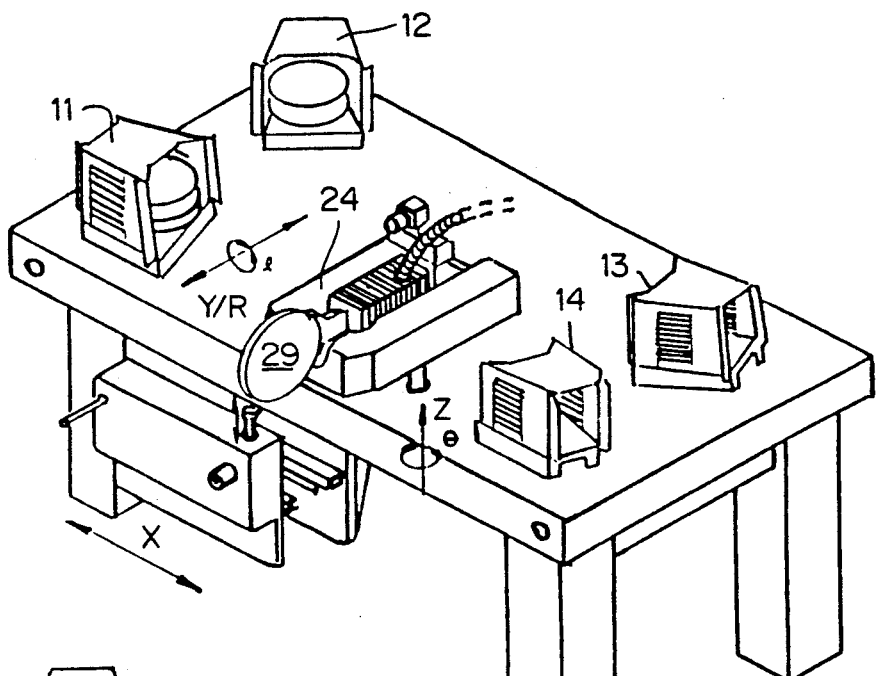
FIG. 11 illustrates the gripper with the wafer turned by 90°.
Figure 12:
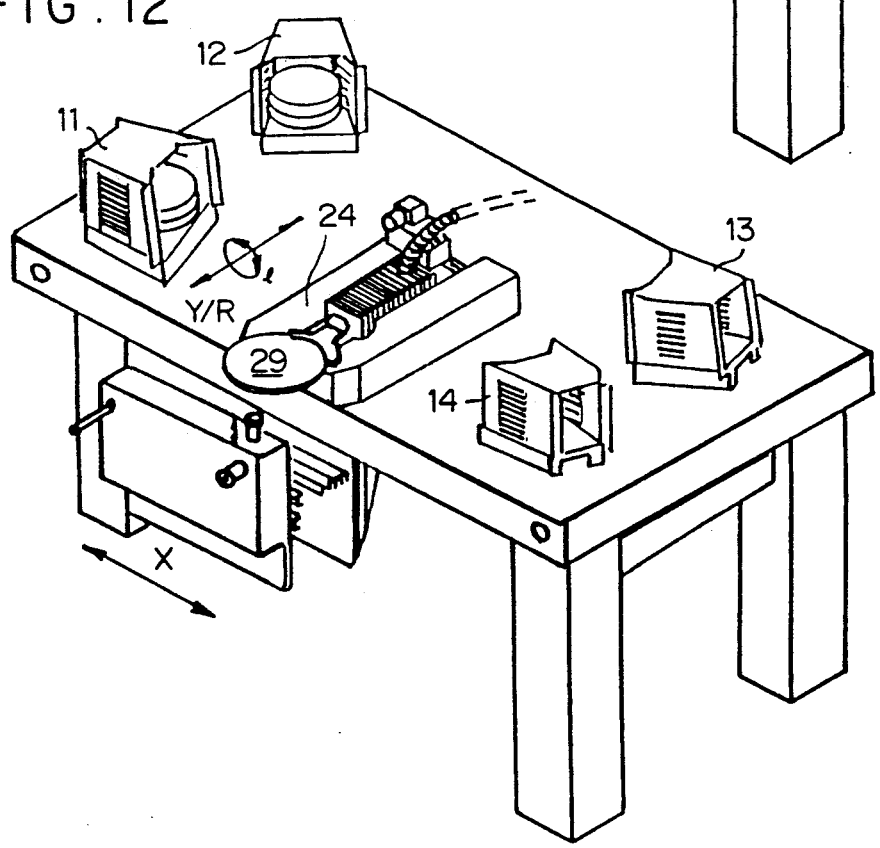
FIG. 12 illustrates the wafer turned by a further 90°, with the printed circuit facing downwards.

FIGS. 10, 11 and 12 illustrate the operation of the robot arm and its gripper for turning the wafer by 180°, so tat in the inspection position the printed circuit points downwards. The robot arm 24 moves forward, facing cassette 11, it is located beneath a wafer to be removed, grips it by means of the vacuum gripper, moves backwards (retraction of the arm 24), swings to the correct alignment with the Y-coordinate as shown in FIG. 11, turns by 90° and by a further 90°, as shown in FIG. 12. This movement allows inspection of both sides of the wafer, the main inspection of the printed circuit being made as shown in FIG. 12, with the printed circuit facing downwards, to avoid contamination.

After the inspection the wafers are graded: good-to cassette 12; repairable to cassette 13, and discarded to cassette 14. From the initial removal from cassette 11 and to the end of the inspection the wafer is held all the time by the gripper mechanism and not transferred to any other mechanism. Both the robot arm and the inspection mechanism, which define the Y and X coordinates of the system are rigidly attached to the floating table 22, thus eliminating vibrations and inaccuracies.

The flipped-over wafer is first scanned by a scanning mechanism, which can operate via the optics of the inspection device, or be in the form of an upward-pointing focused small light source such as an LED, which scans the edges of the wafer, making a number of passes (parallel with each other), each time when the light point passes the boundary of the wafer defining one of the points of its circumference. This, and also the flat, make possible the exact definition of the wafer. Furthermore, mechanical or optical means can be used to align the picture of the printed circuit so that its coordinates will be aligned with the coordinates of the X-Y scan.

We claim:

1. A system for the inspection of printed circuits and other microelectronic elements on wafers of silicon and other semiconductors or suitable substrates comprising in a single transfer mechanism the combination of:

a robot arm for holding wafers during the entire inspection sequence and adapted to carry out an angular motion in a given plane, to align itself along a defines axis (the Y axis), to turn about its axis, and to move as required along the Y axis;

a vibration isolated table supporting said robot arm and cassettes for storing wafers before and after inspection, said vibration isolated table essentially eliminating vibrations of the wafer during the inspection process;

inspection means arranged so as to point upwards for inspection of the wafer which faces downwards as held by the robot arm and for determining alignment and a center of a printed circuit on the wafer prior to start of actual inspection of its printed circuit, the robot arm and the inspection means being mounted on the same vibration isolated table, scanner means using the circumference of the wafer and a flat segment of the wafer for establishing the exact position of the wafer, center of the wafer and center of the printed circuit on the wafer, the robot arm being able to swing about a desired angle in the X—Y plane, to turn about its axis, and to extend or retract about its axis, and an axis of the robot arm defines the Y direction, and the inspection means moves perpendicular to the Y direction (in the X direction).

2. A system according to claim 1, further comprising a plurality of cassettes for housing the wafers, one being the container for wafers prior to inspection, the others being the containers for housing the wafers according to a selection, according to the results of the inspection.

3. A system according to claim 1, wherein said inspection means includes one of an optical microscope, UV microscope, IR microscope, particle beam device, surface scanning device, laser microscope, dark field inspection device, and tunneling microscope.

* * * * *